United States Patent
Lee

(10) Patent No.: US 11,563,200 B2
(45) Date of Patent: Jan. 24, 2023

(54) DISPLAY DEVICE

(71) Applicant: Samsung Display Co., LTD., Yongin-si (KR)

(72) Inventor: Jun Hee Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 135 days.

(21) Appl. No.: 17/196,377

(22) Filed: Mar. 9, 2021

(65) Prior Publication Data

US 2021/0351384 A1   Nov. 11, 2021

(30) Foreign Application Priority Data

May 8, 2020 (KR) .......................... 10-2020-0054984

(51) Int. Cl.
  *H01L 51/52* (2006.01)
  *H01L 27/32* (2006.01)

(52) U.S. Cl.
  CPC ...... *H01L 51/5284* (2013.01); *H01L 27/3258* (2013.01); *H01L 27/3272* (2013.01); *H01L 27/3248* (2013.01)

(58) Field of Classification Search
  CPC ............. H01L 51/5284; H01L 27/3258; H01L 27/3272; H01L 27/3248; H01L 27/1218; H01L 27/1255; H01L 27/3262; H01L 51/0097; H01L 2251/5338; H01L 27/1225; H01L 27/1248; H01L 27/3246
  See application file for complete search history.

(56) References Cited

U.S. PATENT DOCUMENTS

| | | | |
|---|---|---|---|
| 2010/0176395 | A1 | 7/2010 | Choi et al. |
| 2011/0115839 | A1 | 5/2011 | Takahashi et al. |
| 2015/0364513 | A1* | 12/2015 | Takahashi ......... H01L 27/14632 257/292 |
| 2017/0279084 | A1* | 9/2017 | Sakamoto ........... H01L 27/3258 |
| 2019/0181189 | A1* | 6/2019 | Chang ................ H01L 27/3213 |
| 2019/0348624 | A1* | 11/2019 | Kim .................... H01L 27/3246 |
| 2020/0243635 | A1 | 7/2020 | Lee et al. |

FOREIGN PATENT DOCUMENTS

| | | |
|---|---|---|
| KR | 10-2011-0052948 | 5/2011 |
| KR | 10-2018-0014905 | 2/2018 |
| KR | 10-2020-0093718 | 8/2020 |

* cited by examiner

*Primary Examiner* — Kevin Quarterman
(74) *Attorney, Agent, or Firm* — Kile Park Reed & Houtteman PLLC

(57) ABSTRACT

A display device includes a first semiconductor pattern on a substrate, a first insulating layer on the first semiconductor pattern, a first gate electrode on the first insulating layer, a second insulating layer on the first gate electrode, a second semiconductor pattern on the second insulating layer, a material of the second semiconductor pattern being different from that of the first semiconductor pattern, a third insulating layer on the second semiconductor pattern, a second gate electrode on the third insulating layer, a first planarization layer overlapping the second gate electrode, a second planarization layer on the first planarization layer and including a light blocking portion, and a pixel definition layer on the second planarization layer, wherein at least a portion of the pixel definition layer directly contacts the light blocking portion of the second planarization layer.

20 Claims, 12 Drawing Sheets

DISPLAY DEVICE

CROSS-REFERENCE TO RELATED APPLICATION(S)

This application claims priority to and benefits of Korean Patent Application No. 10-2020-0054984 under 35 U.S.C. § 119, filed on May 8, 2020 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. Accordingly, various types of display devices such as a liquid crystal display (LCD), an organic light emitting display (OLED) and the like have been developed. Among the display devices, the organic light emitting display device displays an image using an organic light emitting element that generates light by a recombination of electrons and holes. The organic light emitting display device may include transistors that may provide a driving current to the organic light emitting element.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of blocking external light.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment of a display device may include a first semiconductor pattern disposed on a substrate; a first insulating layer disposed on the first semiconductor pattern; a first gate electrode disposed on the first insulating layer; a second insulating layer disposed on the first gate electrode; a second semiconductor pattern disposed on the second insulating layer, wherein a material of the second semiconductor pattern may be different from that of the first semiconductor pattern; a third insulating layer disposed on the second semiconductor pattern; a second gate electrode disposed on the third insulating layer; a first planarization layer overlapping the second gate electrode; a second planarization layer disposed on the first planarization layer and including a light blocking portion; and a pixel definition layer disposed on the second planarization layer, wherein at least a portion of the pixel definition layer may directly contact the light blocking portion of the second planarization layer.

The second planarization layer and the first planarization layer may include a same material, and the second planarization layer may include a light absorbing material.

The first planarization layer may include a transparent region overlapping the light blocking portion of the second planarization layer.

The second planarization layer may include a light transmissive portion which may not overlap the light blocking portion of the second planarization layer, and a light transmittance of the light blocking portion may be less than a light transmittance of the light transmissive portion.

The light transmittance of the light transmissive portion of the second planarization layer may be same as a light transmittance of the first planarization layer.

A top surface of the first planarization layer may be parallel to a top surface of the light blocking portion of the second planarization layer.

The first planarization layer may include a sub-light blocking portion overlapping at least a portion of the light blocking portion of the second planarization layer.

A light transmittance of the sub-light blocking portion of the first planarization layer may be same as a light transmittance of the light blocking portion of the second planarization layer.

An anode electrode may be disposed on the second planarization layer and directly contact the light blocking portion of the second planarization layer, wherein the pixel definition layer may include an opening that partially exposes the anode electrode.

The light blocking portion of the second planarization layer may overlap an entire region of the second semiconductor pattern.

The light blocking portion of the second planarization layer and the second semiconductor pattern may have a same pattern in a plan view.

The light blocking portion of the second planarization layer may overlap at least a portion of the first semiconductor pattern.

A light transmittance of the light blocking portion of the second planarization layer may be uniform in an entire region of the light blocking portion of the second planarization layer.

The light blocking portion of the second planarization layer may be disposed in an entire region of the second planarization layer.

A connection electrode may be disposed between the first planarization layer and the second planarization layer, wherein a side surface and at least a portion of a top surface of the connection electrode may directly contact the light blocking portion of the second planarization layer.

The first semiconductor pattern may include polycrystalline silicon, and the second semiconductor pattern may include an oxide semiconductor.

An embodiment of a display device may include a semiconductor pattern disposed on a substrate; a gate insulating layer disposed on the semiconductor pattern; a gate electrode disposed on the gate insulating layer; an interlayer insulating layer disposed on the gate electrode; a data wiring disposed on the interlayer insulating layer and electrically contacting a portion of the semiconductor pattern through a first contact hole formed in the interlayer insulating layer and the gate insulating layer; a light transmissive planarization layer disposed on the data wiring; a connection electrode disposed on the light transmissive planarization layer and electrically connected to the data wiring through a second contact hole formed in the light transmissive planarization layer; a light blocking planarization layer disposed on the light transmissive planarization layer; a pixel electrode disposed on the light blocking planarization layer and electrically connected to the connection electrode through a third contact hole formed in the light blocking planarization layer; a pixel definition layer disposed on the light blocking planarization layer and including an opening to expose at least a portion of the pixel electrode; an organic layer disposed on the pixel electrode; and a common electrode disposed on the organic layer, wherein a top surface of the light blocking planarization layer may directly contact the pixel definition layer.

The semiconductor pattern may include an oxide semiconductor.

The planarization layer may overlap an entire region of the semiconductor pattern.

A light transmittance of the light blocking planarization layer may be uniform in an entire region of the light blocking planarization layer.

According to an embodiment, the display device may be capable of suppressing or preventing performance degradation of transistors inside the display device by blocking external light.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
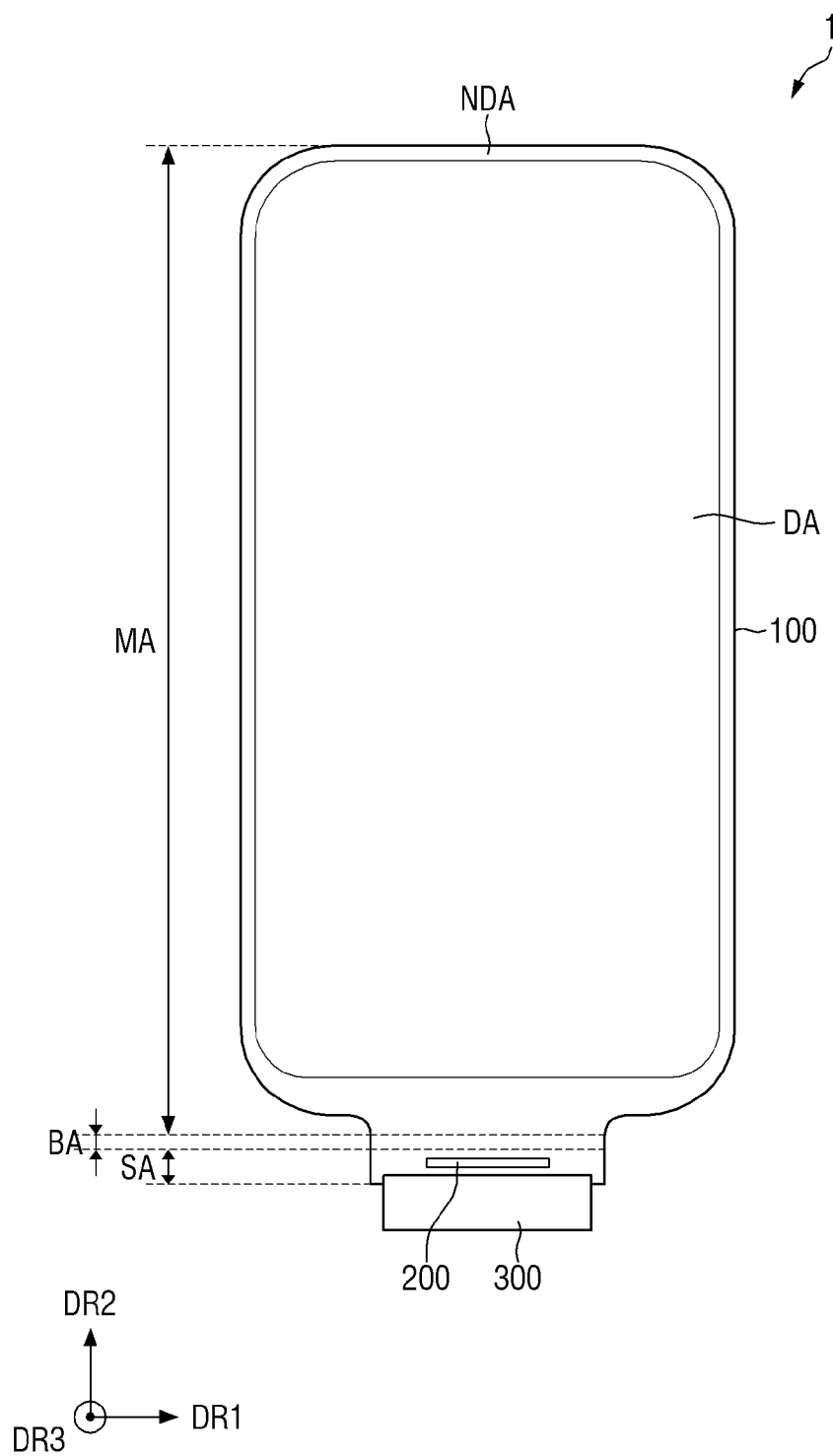
FIG. 1 is a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

An expression used in the singular encompasses the expression of the plural, unless it has a clearly different meaning in the context.

In the specification, it is to be understood that the terms such as "including," "having," and "comprising" and variations thereof are intended to indicate the existence of the features or components disclosed in the specification, and are not intended to preclude the possibility that one or more other features or components may exist or may be added.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

In addition, terms such as "below," "lower," "above," "upper," and the like are used to describe the relationship of the configurations shown in the drawings. The terms are used as a relative concept and may be described with reference to the direction indicated in the drawings.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings.

Figure 2:
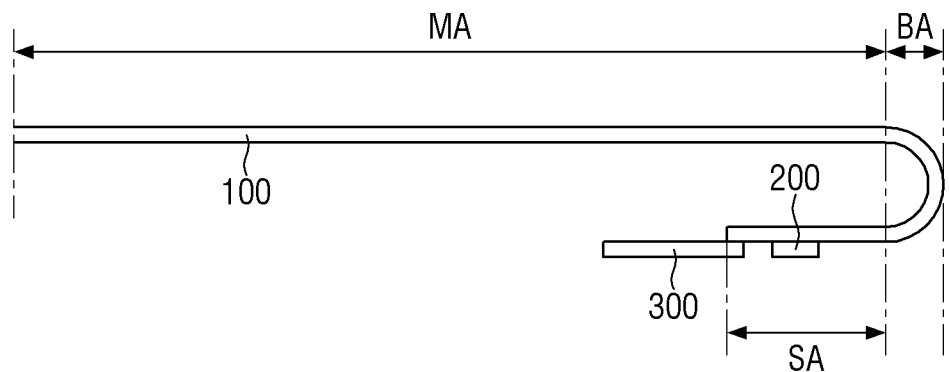
FIG. 2 is a side view of the display device of FIG. 1.
Figure 2:
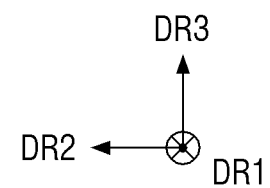

FIG. 1 is a plan view of a display device according to an embodiment. FIG. 2 is a side view of the display device of FIG. 1. FIG. 2 shows a side elevation of the display device bent in the thickness direction.

A display device 1 may be a device for displaying a moving image or a still image. The display device 1 may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 1 according to an embodiment may have a substantially rectangular shape in a plan view. The display device 1 may have a substantially rectangular shape with substantially right-angled corners in a plan view. However, without being limited thereto, the display device 1 may have a rectangular shape with substantially rounded corners in a plan view.

In the drawings, a first direction DR1 indicates a horizontal direction of the display device 1 in a plan view, and a second direction DR2 indicates a vertical direction of the display device 1 in a plan view. A third direction DR3 indicates a thickness direction of the display device 1. The first direction DR1 and the second direction DR2 may perpendicularly intersect each other. The third direction DR3 may be a direction intersecting the plane on which the first direction DR1 and the second direction DR2 may be located, and may perpendicularly intersect both the first direction DR1 and the second direction DR2. It should be understood, however, that a direction mentioned in an embodiment refers to a relative direction and an embodiment is not limited to the direction mentioned.

Unless otherwise defined, the terms "above," "top surface," and "upper side" as used herein refer to a display surface's side of a display panel 100, and the terms "below," "bottom surface," and "lower side" as used herein refer to a side opposite to the display surface of the display panel 100.

Referring to FIGS. 1 and 2, the display device 1 may include a display panel 100. The display panel 100 may be a flexible substrate including a flexible polymer material such as polyimide within the spirit and the scope of the disclosure. Accordingly, the display panel 100 may be bent, folded or rolled.

The display panel 100 may be an organic light emitting display panel. In the following embodiments, a case where the organic light emitting display panel may be used as the display panel 100 will be described as an example, but the disclosure is not limited thereto, and other types of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be used as the display panel 100.

The display panel 100 may include a display area DA displaying a screen and a non-display area NDA where no display may be displayed. The display panel 100 may be divided into the display area DA and the non-display area NDA in a plan view. The non-display area NDA may be disposed to surround or to be adjacent to the display area DA. The non-display area NDA may form a bezel.

The display area DA may have a substantially rectangular shape with substantially right-angled or rounded corners in a plan view. However, the planar shape of the display area DA is not limited to a substantially rectangular shape, but may have a substantially circular shape, a substantially elliptical shape, or various other shapes.

The display area DA may include pixels. The pixels may be arranged or disposed in a matrix. Each pixel may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be encapsulated by an encapsulation layer. A detailed configuration or structure of the pixel will be described later.

The non-display area NDA may surround or may be adjacent to all sides of the display area DA and may form edges of the display area DA. However, the disclosure is not limited thereto.

The display panel 100 may include a main region MA and a bending region BA connected to one or a side of the main region MA in the second direction DR2. The display panel 100 may include a sub-region SA which may be connected to the bending region BA on one or a side of the second direction DR2 and bent in a thickness direction to overlap the main region MA in the thickness direction.

The display area DA may be located or disposed in the main region MA. The non-display area NDA may be located or disposed in the peripheral edge portion of the display area DA of the main region MA.

The main region MA may have a shape similar to an outer shape of the display device 1 in a plan view. The main region MA may be a flat region located or disposed on one or a plane. However, the disclosure is not limited thereto, and at least one edge of the remaining edges except an edge (or side) of the main region MA connected to the bending region BA may be bent in a substantially curved shape or bent in a substantially vertical direction.

If at least one of the edges other than the edge (or side) of the main region MA connected to the bending region BA is curved or bent, the display area DA may also be disposed on the corresponding edge. However, the disclosure is not limited thereto, and the non-display area NDA that may not display a screen and/or image(s) may be disposed on the curved or bent edge. Alternatively, both the display area DA and the non-display area NDA may be disposed thereon.

The non-display area NDA of the main region MA may be placed or disposed in an area from the outer boundary of the display area DA to the or an edge of the display panel 100. Signal lines or driving circuits may be disposed in the non-display area NDA of the main region MA to apply a signal to the display area DA.

The bending region BA may be connected through one short side of the main region MA. The width (width in the first direction DR1) of the bending region BA may be smaller or less than the width (width of the short side) of the main region MA. A connection portion between the main region MA and the bending region BA may have a substantially L-shaped cut portion to reduce the width of the bezel.

In the bending region BA, the display panel 100 may be bent with a curvature in a direction opposite to the display surface. The surface of the display panel 100 may be reversed as the display panel 100 is bent in the bending region BA. In other words, one surface of the display panel 100 facing upward may be changed to face laterally outward through the bending region BA and then to face downward.

The sub-region SA may extend from the bending region BA. The sub-region SA may extend in a direction parallel to the main region MA from a point where bending may be completed. The sub-region SA may overlap the main region MA in the thickness direction of the display panel 100. The sub-region SA may overlap the non-display area NDA of the edge of the main region MA and may overlap the display area DA of the main region MA. The width of the sub-region SA may be the same as the width of the bending region BA, but is not limited thereto.

A pad member (not shown) may be arranged or disposed on the sub-region SA of the display panel 100. An external device may be mounted on (or attached to) the pad member (not shown). The external device may include a driving chip 200 and a driving board 300 composed of a flexible or rigid printed circuit board, a wiring connection film, a connector, or the like may also be mounted on the pad member as an external device. It may be possible for one or more external devices to be mounted on the sub-region SA. For example, as shown for example in FIGS. 1 and 2, the driving chip 200 may be arranged or disposed on the sub-region SA of the display panel 100, and the driving board 300 may be attached to one or an end of the sub-region SA. In this case, the display panel 100 may include a pad member electrically connected to the driving chip 200 and another pad member electrically connected to the driving board 300. In an embodiment, the driving chip 200 may be mounted on a film, which may be adhered to the sub-region SA of the display panel 100.

The driving chip 200, which may be mounted on one or a surface of the display panel 100 which may be the same surface as the display surface, may be mounted on the surface of the display panel 100 facing downward in the thickness direction as the bending region BA is bent and reversed as described above such that the top surface of the driving chip 200 may face downward.

The driving chip 200 may be attached onto the display panel 100 through an anisotropic conductive film or through ultrasonic bonding. The driving chip 200 may include an integrated circuit for driving the display panel 100.

Figure 3:
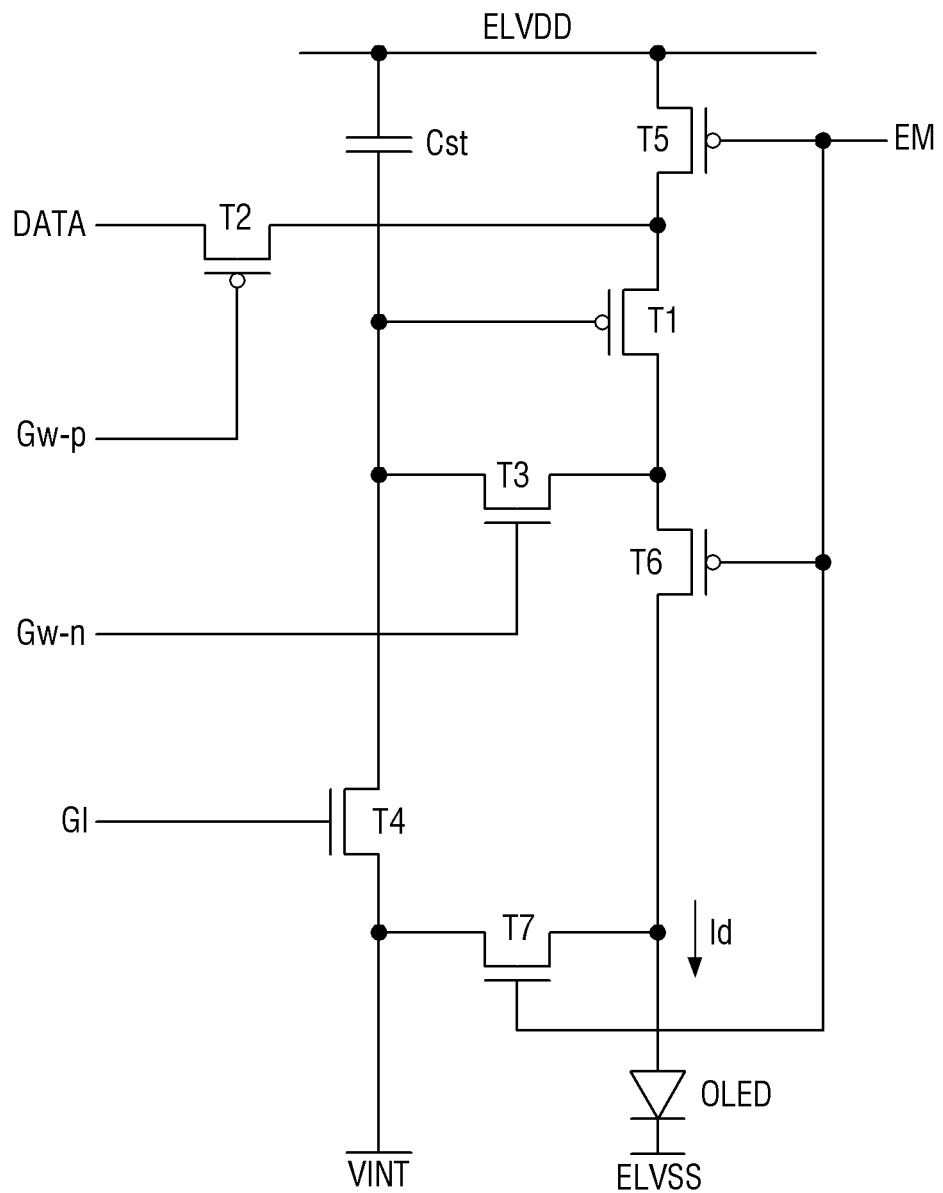
FIG. 3 is an equivalent circuit diagram of one pixel of a display device according to an embodiment.

FIG. 3 is an equivalent circuit diagram of one or a pixel of a display device according to an embodiment.

Referring to FIG. 3, a circuit of one or a pixel of an organic light emitting display device may include a light emitting element OLED, transistors T1 to T7 and a capacitor Cst. A data signal DATA, a first scan signal Gw-p, a second scan signal Gw-n, a third scan signal GI, an emission control signal EM, a first source voltage ELVDD, a second source voltage ELVSS, and an initialization voltage VINT may be applied to a circuit of one or a pixel.

The light emitting element OLED may include an anode electrode and a cathode electrode. The capacitor Cst may include a first electrode and a second electrode. Although the description is directed to the case where the light emitting element OLED may be an organic light emitting diode, the disclosure is not limited thereto, and the same reference numeral is given to the organic light emitting diode OLED and the light emitting element OLED.

The transistors may include first to seventh transistors T1 to T7. Each of the transistors T1 to T7 may include a gate electrode, a first source/drain electrode, and a second source/drain electrode. One of the first and second source/drain electrodes of each of the transistors T1 to T7 may become a source electrode, and the other may become a drain electrode.

Each of the transistors T1 to T7 may be a thin film transistor. The transistors T1 to T7 may each be one of a PMOS transistor and a NMOS transistor. In an embodiment, the first transistor T1 as a driving transistor, the second transistor T2 as a data transfer transistor, the fifth transistor T5 as a first light emitting control transistor, and the sixth transistor T6 as a second light emitting control transistor may each be a PMOS transistor. Meanwhile, the third transistor T3 as a compensation transistor, the fourth transistor T4 as a first initialization transistor, and the seventh transistor T7 as a second initialization transistor may each be an NMOS transistor. The PMOS transistor and the NMOS transistor differ in characteristics, and the third transistor T3, the fourth transistor T4, and the seventh transistor T7 may each be implemented as an NMOS transistor having relatively superior turn-off characteristics, which may reduce leakage of a driving current Id during the light emission period of the organic light emitting diode OLED.

Hereinafter, each component will be described in detail.

The gate electrode of the first transistor T1 may be electrically connected to a first electrode CE1 of the capacitor Cst. The first source/drain electrode of the first transistor T1 may be electrically connected to the first source voltage ELVDD terminal via the fifth transistor T5. The second source/drain electrode of the first transistor T1 may be electrically connected to the anode electrode of the organic light emitting diode (OLED) via the sixth transistor T6. The first transistor T1 may supply the driving current Id to the light emitting diode OLED based on the data signal DATA received according to a switching operation of the second transistor T2.

The gate electrode of the second transistor T2 may be electrically connected to the first scan signal Gw-p terminal. The first source/drain electrode of the second transistor T2 may be electrically connected to the data signal DATA terminal. The second source/drain electrode of the second transistor T2 may be electrically connected to the first source/drain electrode of the first transistor T1 and also may be electrically connected to the first source voltage ELVDD terminal via the fifth transistor T5. The second transistor T2 may be turned on according to the first scan signal Gw-p to carry out a switching operation to transfer the data signal DATA to the first source/drain electrode of the first transistor T1.

The gate electrode of the third transistor T3 may be electrically connected to the second scan signal Gw-n terminal. The first source/drain electrode of the third transistor T3 may be electrically connected to the second source/drain electrode of the first transistor T1 and also electrically connected to the anode electrode of the organic light emitting diode OLED via the sixth transistor T6. The second source/drain electrode of the third transistor T3 may be electrically connected simultaneously to the first electrode CE1 of the capacitor Cst, the first source/drain electrode of the fourth transistor T4, and the gate electrode of the first transistor T1. The third transistor T3 may be turned on, according to the second scan signal Gw-n, to electrically connect the gate electrode and the second source/drain electrode of the first transistor T1, whereby the first transistor T1 forms a diode connection. As a consequence, a voltage difference as much as the threshold voltage of the first transistor T1 may occur between the first source/drain electrode and the gate electrode of the first transistor T1, and a threshold voltage-compensated data signal DATA may be supplied to the gate electrode of the first transistor T1 to compensate for the threshold voltage deviation of the first transistor T1.

The gate electrode of the fourth transistor T4 may be electrically connected to a terminal of the third scan signal GI. The second source/drain electrode of the fourth transistor T4 may be electrically connected to the initialization voltage VINT terminal. The first source/drain electrode of the fourth transistor T4 may be electrically connected simultaneously to the first electrode CE1 of the capacitor Cst, the second source/drain electrode of the third transistor T3, and the gate electrode of the first transistor T1. The transistor T4 may be turned on according to the third scan signal GI to transfer the initial voltage VINT to the gate electrode of the first transistor T1 to carry out an operation of initializing the voltage of the gate electrode of the first transistor T1.

The gate electrode of the fifth transistor T5 may be electrically connected to the emission control signal EM terminal. The first source/drain electrode of the fifth transistor T5 may be electrically connected to the first source voltage ELVDD terminal. The second source/drain electrode of the fifth transistor T5 may be electrically connected to the first source/drain electrode of the first transistor T1 and the second source/drain electrode of the second transistor T2.

The gate electrode of the sixth transistor T6 may be electrically connected to the emission control signal EM terminal. The first source/drain electrode of the sixth transistor T6 may electrically connect the source/drain electrode of the first transistor T1 and the first source/drain electrode of the third transistor T3. The second source/drain electrode of the sixth transistor T6 may be electrically connected to the anode electrode of the organic light emitting diode OLED.

The fifth transistor T5 and the sixth transistor T6 may be simultaneously turned on in response to the emission control signal EM so that the driving current Id may flow through the organic light emitting diode OLED.

The gate electrode of the seventh transistor T7 may be electrically connected to a terminal of the emission control signal EM. The first source/drain electrode of the seventh transistor T7 may be electrically connected to the anode electrode of the organic light emitting diode OLED. The second source/drain electrode of the seventh transistor T7 may be electrically connected to the initialization voltage VINT terminal. The seventh transistor T7 may be turned on according to the emission control signal EM to initialize the anode electrode of the organic light emitting diode OLED.

Although receiving the same emission control signal EM as that received by the fifth and sixth transistors T5 and T6, the seventh transistor T7 may be turned on at a different timing because the seventh transistor T7 may be a NMOS transistor and the fifth and sixth transistors T5 and T6 may be PMOS transistors. For example, in the case where the emission control signal EM is at a high level, the seventh transistor T7 may be turned on while the fifth and sixth transistors T5 and T6 may be turned off. In the case where the emission control signal EM is at a low level, the seventh transistor T7 may be turned off while the fifth and sixth transistors T5 and T6 may be turned on. The seventh transistor T7 may not perform the initialization operation at the emission timing, in a case that the fifth and sixth transistors T5 and T6 may be turned on, and may perform the initialization at the non-emission timing, in a case that the fifth and sixth transistors T5 and T6 may be turned off.

Although an embodiment is directed to the case where the emission control signal EM may be applied to the gate electrode of the seventh transistor T7, a pixel circuit may be configured or structured such that the third scan signal GI may be applied to the gate electrode of the seventh transistor T7 in an embodiment.

The second electrode CE2 of the capacitor Cst may be electrically connected to the first source voltage ELVDD terminal. The first electrode CE1 of the capacitor Cst may be electrically connected simultaneously to the gate electrode of the first transistor T1, the second source/drain electrode of the third transistor T3, and the first source/drain electrode of the fourth transistor T4. The cathode electrode of the organic light emitting diode OLED may be electrically connected to the second source voltage ELVSS terminal. The organic light emitting diode OLED may receive the driving current Id from the first transistor T1 and emit light to display an image.

Hereinafter, a description is made of the schematic cross-sectional structure of the display panel 100 with reference to FIGS. 4 and 5.

Figure 4:
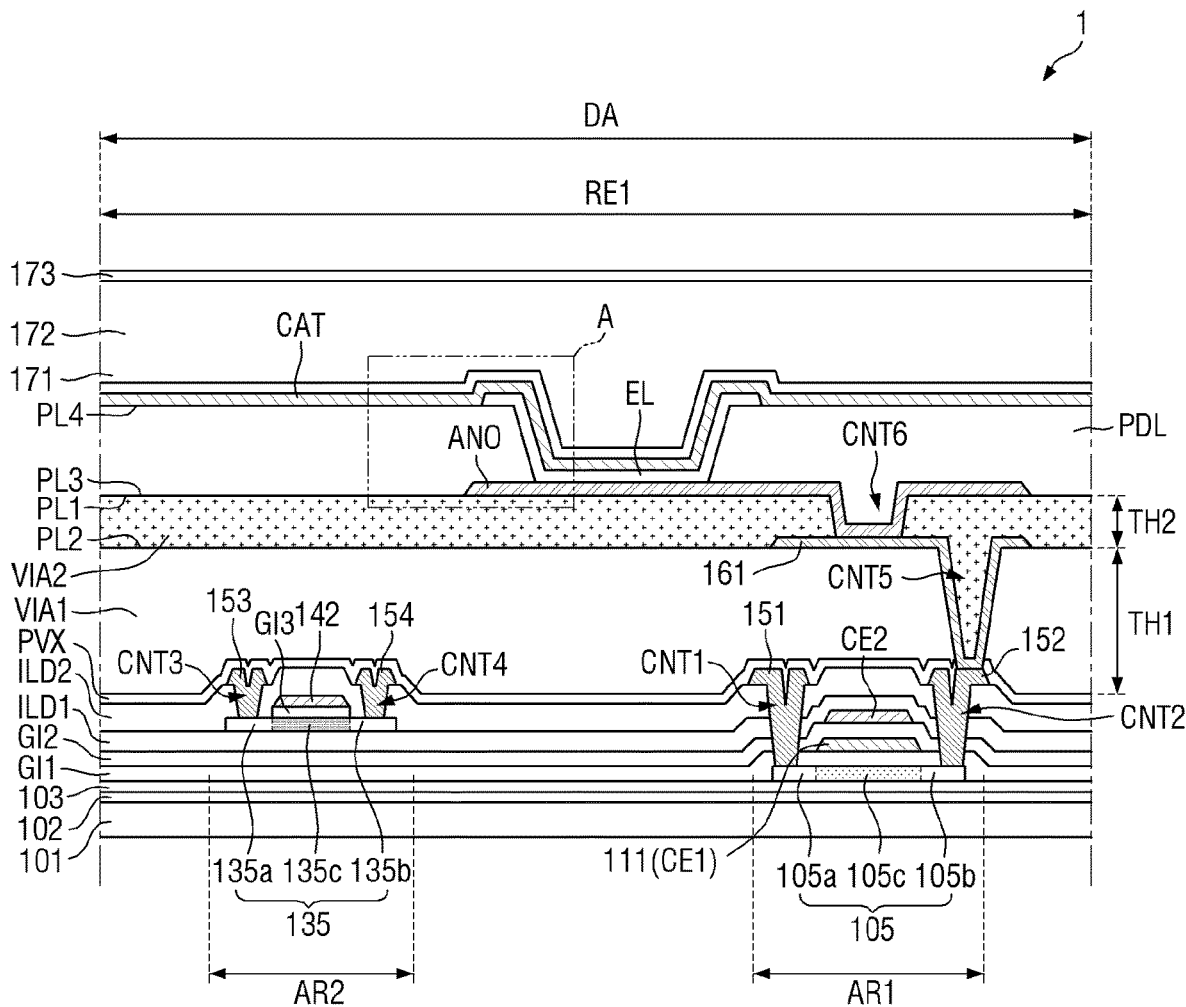
FIG. 4 is a schematic cross-sectional view illustrating a cross-section around a pixel.

FIG. 4 is a schematic cross-sectional view illustrating a cross-section around a pixel of a display area and a bending region of a non-display area. FIG. 5 is an enlarged view of area A of FIG. 4. FIG. 4 shows a cross-sectional structure of one or a pixel (PX) of the display panel 100.

Figure 5:
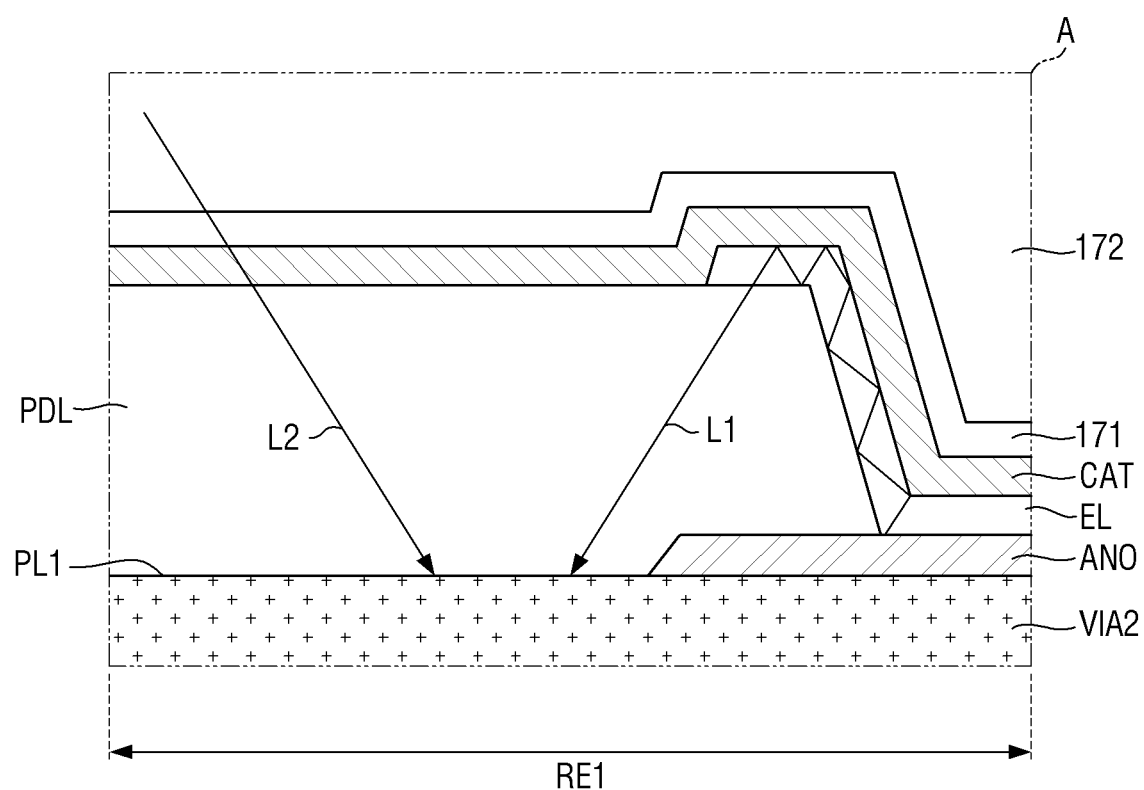
FIG. 5 is an enlarged view of area A of FIG. 4.

With reference to FIGS. 4 and 5, the display panel 100 may include a silicon transistor region AR1 in which a non-oxide inorganic semiconductor transistor (hereinafter, referred to as 'silicon transistor') including polycrystalline silicon as a channel may be arranged or disposed and an oxide transistor region AR2 in which an oxide semiconductor transistor (hereinafter, referred to as 'oxide transistor') including an oxide semiconductor as a channel may be arranged or disposed.

The silicon transistor arranged or disposed in the silicon transistor region AR1 may be a PMOS transistor and, in FIG. 4, the first transistor T1 as a driving transistor is shown, by way of example, as the silicon transistor. The oxide transistor arranged or disposed in the oxide transistor region AR2 may be an NMOS transistor and, in FIG. 4, the third transistor T3 as a compensation transistor is shown, by way of example, as the oxide transistor. Although not shown in the drawing, other silicon transistors such as the second transistor T2, the fifth transistor T5, and the sixth transistor T6 arranged or disposed in the silicon transistor region AR1 may have the substantially same layered structure as that of the first transistor T1, and other oxide transistors such as the fourth transistor T4 and the seventh transistor T7 arranged or disposed in the oxide transistor region AR2 may have substantially the same layered structure as that of the third transistor T3. The detailed descriptions of the silicon transistor and the oxide transistor are described later.

In the display area DA of the display panel 100, a base substrate 101, a barrier layer 102, a buffer layer 103, a first semiconductor layer PS, a first gate insulating layer GI1, a first conductive layer 110, a second gate insulating layer GI2, a second conductive layer 120, a first interlayer insulating layer ILD1, a second semiconductor layer OS, a third gate insulating layer GI3, a third conductive layer 140, a second interlayer insulating layer ILD2, a fourth conductive layer 150, a first via layer VIA1, a fifth conductive layer 160, a second via layer VIA2, an anode electrode ANO, and a pixel definition layer PDL may be arranged or disposed in order. Each of the layers described above may consist of a single layer, or a stack of multiple layers. Other layers may be disposed between the layers.

The base substrate 101 may support the respective layers disposed thereon. The base substrate 101 may be made of, for example, an insulating material such as a polymer resin. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may include a metal material.

The base substrate 101 may be a flexible substrate which may be bent, folded or rolled. An example of the material of the flexible substrate may be polyimide (PI), but is not limited thereto.

A transparent substrate may be used in a case that the organic light emitting display device may be a bottom emission type or a double-sided emission type. In a case that the organic light emitting display device may be a top emission type, in addition to a transparent substrate, a translucent or opaque substrate may be applied.

The barrier layer 102 may be disposed on the base substrate 101. The barrier layer 102 may prevent diffusion of impurity ions, prevent penetration of moisture or external air, and perform a surface planarization function. The barrier layer 102 may include silicon nitride, silicon oxide, silicon oxynitride, within the spirit and the scope of the disclosure. The barrier layer 102 may be omitted depending on the type of the base substrate 101, process conditions, within the spirit and the scope of the disclosure.

The buffer layer 103 may be disposed on the barrier layer 102. The buffer layer 103 may include at least one of silicon nitride, silicon oxide, or silicon oxynitride. The buffer layer 103 may be omitted depending on the type of the base substrate 101, process conditions, within the spirit and the scope of the disclosure.

The first semiconductor layer PS may be disposed on the buffer layer 103. The first semiconductor layer PS may include a first semiconductor pattern 105. The first semiconductor pattern 105 may be disposed in the silicon transistor region AR1.

The first semiconductor pattern 105 may include a channel region 105$c$ disposed to overlap the first gate electrode 111 disposed thereabove in the thickness direction and a first source/drain region 105$a$ and a second source/drain region 105$b$ of the first semiconductor pattern 105 that may be respectively located or disposed at one or an and the other ends of the channel region 105$c$. The first and second source/drain regions 105$a$ and 105$b$ of the first semiconductor pattern 105 may include carrier ions and may have a high conductivity and low electric resistance in comparison with the channel region 105$c$.

The first semiconductor layer PS may be a semiconductor layer of the first transistor T1, the second transistor T2, the fifth transistor T5, and the sixth transistor T6, and it may form the channels of the corresponding transistors.

The first semiconductor layer PS may be made of polycrystalline silicon, monocrystalline silicon, amorphous silicon, within the spirit and the scope of the disclosure. In the case where the first semiconductor PS is made of polycrystalline silicon, the polycrystalline silicon may be formed by crystallizing amorphous silicon using a crystallization method such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

The first gate insulating layer GI1 may be disposed on the first semiconductor layer OS. The first gate insulating layer GI1 may cover or overlap the side surfaces of the first semiconductor 105 as well as the top surface of the first semiconductor pattern 105 with the exception of the part where the contact holes CNT1 and CNT2 may be formed. The first gate insulating layer GI1 may be disposed to mostly cover or overlap the whole surface of the base substrate 101.

The first gate insulating layer GI1 may include a silicon compound, a metal oxide, within the spirit and the scope of the disclosure. For example, the first gate insulating layer GI1 may include silicon oxide, silicon nitride, silicon oxynitride, aluminum oxide, tantalum oxide, hafnium oxide, zirconium oxide, titanium oxide, within the spirit and the scope of the disclosure. These may be used alone or in combination with each other.

The first conductive layer 110 may be disposed on the first gate insulating layer GI1. The first conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The first conductive layer 110 may be a gate conductive layer and may include the first gate electrode 111 disposed in the silicon transistor region AR1. The first gate electrode 111 may be a gate electrode of a silicon transistor. The first gate electrode 111 may be electrically connected to the first electrode CE1 of the capacitor Cst. The first electrode CE1 of the capacitor Cst may be formed as the first gate electrode 111 in itself and as part extended from the first gate electrode 111. For example, a part of the integrated pattern of the first conductive layer 110 may overlap the first semiconductor pattern 105 and function as the first gate electrode 111 at the corresponding region, and another part may not overlap the first semiconductor pattern 105 and function as the first electrode CE1 of the capacitor Cst overlapping the second electrode CE2 of the capacitor Cst disposed thereon.

The second gate insulating layer GI2 may be disposed on the first conductive layer 110. The second gate insulating layer GI2 may cover or overlap the side surfaces of the first gate electrode 111 as well as the top surface of the first gate electrode 111 with the exception of the part where the contact holes CNT1 and CNT2 may be formed. The second gate insulating layer GI2 may be disposed mostly over the whole surface of the first gate insulating layer GI1.

The second gate insulating layer GI2 may include a silicon compound, metal oxide, within the spirit and the scope of the disclosure. For example, the second gate insulating layer GI2 may include silicon oxide, silicon nitride, silicon oxynitride, aluminum oxide, tantalum oxide, hafnium oxide, zirconium oxide, titanium oxide, within the spirit and the scope of the disclosure. These may be used alone or in combination with each other.

The second conductive layer 120 may be disposed on the second gate insulating layer GI2. The second conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second conductive layer 120 may be a capacitor conductive layer and may include the second electrode CE2 of the capacitor Cst arranged or disposed in the silicon transistor region AR1. The second electrode CE2 of the capacitor Cst may face the first electrode CE1 of the capacitor Cst electrically connected to the first gate electrode 111 disposed therebelow through the second gate insulating layer GI2 interposed therebetween to form the capacitor Cst.

The first interlayer insulating layer ILD1 may be disposed on the second conductive layer 120. The first interlayer insulating layer ILD1 may include a silicon compound, a metal oxide, within the spirit and the scope of the disclosure. For example, the first interlayer insulating layer ILD1 may include silicon oxide, silicon nitride, silicon oxynitride, aluminum oxide, tantalum oxide, hafnium oxide, zirconium oxide, titanium oxide, within the spirit and the scope of the disclosure. These may be used alone or in combination with each other.

The second conductive layer OS may be disposed on the first interlayer insulating layer ILD1. The second semiconductor layer OS may include the second semiconductor pattern 135. The second semiconductor pattern 135 may be disposed in the oxide transistor region AR2.

The second semiconductor pattern 135 may include a channel region 135c disposed to overlap the third electrode 142 disposed thereabove in the thickness direction and the first source/drain region 135a and the second source/drain region 135b of the second semiconductor pattern 135 that may be respectively located or disposed at one and the other side of the channel region 135c. The first and second source/drain regions 135a and 135b of the second semiconductor pattern 135 may be conductive and may have a high conductivity and a low electric resistance in comparison with the channel region 135c.

The second semiconductor layer OS may be a semiconductor layer of the third transistor T3, the fourth transistor T4, and the seventh transistor T7 and may form the channels of the corresponding transistors.

The second semiconductor pattern 135 may include an oxide semiconductor. The oxide may include at least one selected among gallium-indium-zinc oxide (G-I-Z-O), zinc (Zn), indium (In), gallium (Ga), tin (Sn), cadmium (Cd), germanium (Ge), or hafnium (Hf), or any combination thereof. The oxide may include at least one of indium-gallium-zinc oxide (IGZO), zinc-tin oxide (ZTO), or indium-tin oxide (ITO).

The third gate insulating layer GI3 may be disposed on the second semiconductor layer OS. The third gate insulating layer GI3 may be disposed only in a partial region unlike the first and second gate insulating layers GI1 and GI2. For example, the third gate insulating layer GI3 may cover or overlap the channel region 135c of the oxide semiconductor 135 and may expose the first and second source/drain regions 135a and 135b and the side surfaces of the oxide semiconductor 135. The third gate insulating layer GI3 may have the substantially same pattern as that of the third gate electrode 142 thereon.

The third gate insulating layer GI3 may include a silicon compound, a metal oxide, within the spirit and the scope of the disclosure. For example, the third gate insulating layer GI3 may include silicon oxide, silicon nitride, silicon oxynitride, aluminum oxide, tantalum oxide, hafnium oxide, zirconium oxide, titanium oxide, within the spirit and the scope of the disclosure. These may be used alone or in combination with each other.

The third conductive layer 140 may be disposed on the third gate insulating layer GI3. The third conductive layer 140 may be a gate conductive layer and may include the third gate electrode 142 of the transistor disposed in the oxide transistor region AR2. The third conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second interlayer insulating layer ILD2 may be disposed on the third conductive layer 140. The second interlayer insulating layer ILD2 may include a silicon compound, a metal oxide, within the spirit and the scope of the disclosure. For example, the second interlayer insulating layer ILD2 may include silicon oxide, silicon nitride, silicon oxynitride, aluminum oxide, tantalum oxide, hafnium oxide, zirconium oxide, titanium oxide, within the spirit and the scope of the disclosure. These may be used alone or in combination with each other.

The fourth conductive layer 150 may be disposed on the second interlayer insulating layer ILD2. The fourth conductive layer 150 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The fourth conductive layer 150 may be a data conductive layer and may include data wiring (not shown) for applying the data signal (DATA). The fourth conductive layer 150 may include the first source/drain electrode 151 and the second source/drain electrode 152 of the transistor disposed in the silicon transistor region AR1 and the first source/drain electrode 153 and the second source/drain electrode 154 of the transistor disposed in the oxide transistor region AR2.

The first source/drain electrode 151 of the transistor disposed in the silicon transistor region AR1 may be electrically connected to the first source/drain region 105a of the first semiconductor pattern 105 via the first contact hole CNT1 penetrating the second interlayer insulating layer ILD2, the second gate insulating layer GI2, and the first gate insulating layer GI1 to expose the first source/drain region 105a. The second source/drain electrode 152 may be electrically connected to the second source/drain region 105b of the first semiconductor pattern 105 via the second contact hole CNT2 penetrating the second interlayer insulating layer ILD2, the second gate insulating layer GI2, and the first gate insulating layer GI1 to expose the second source/drain region 105b of the first semiconductor pattern 105.

The first source/drain electrode 153 of the transistor disposed in the oxide transistor region AR2 may be may be electrically connected to the first source/drain region 135a of the second semiconductor pattern 135 via the third contact hole CNT3 penetrating the second interlayer insulating layer ILD2 to expose the first source/drain region 135a of the second semiconductor pattern 135. The second source/drain electrode 154 may be electrically connected to the second source/drain region 135b of the second semiconductor pattern 135 via the fourth contact hole CNT4 penetrating the second interlayer insulating layer ILD2 to expose the second source/drain region of the second semiconductor pattern 135.

A passivation layer PVX may be disposed on the fourth conductive layer 150. The passivation layer PVX may cover or overlap the fourth conductive layer 150 for protection. The passivation layer PVX may cover or overlap the top and side surfaces of the fourth conductive layer 150.

The passivation layer PVX may include an inorganic insulating material such as silicon oxide, silicon nitride, silicon oxynitride, hafnium oxide, aluminum oxide, titanium oxide, tantalum oxide, zinc oxide within the spirit and the scope of the disclosure. Although not illustrated, the passivation layer PVX may be formed or disposed in the display area DA, and may not be formed or disposed in at least a portion of the non-display area NDA.

The first via layer VIA1 (or planarization layer) may be disposed on the passivation layer PVX. The first via layer VIA1 may include an inorganic insulating material or an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The first via layer VIA1 may be disposed on top of the second interlayer layer ILD2 to completely cover or overlap the top surface of the second interlayer insulating layer ILD2. In the case where the first via layer VIA1 may be formed as an organic layer, the top surface thereof may be flat in spite of the offset of the lower part thereof. The first via layer VIA1 may allow most light to pass therethrough. For example, the first via layer VIA1 may include a light transmissive planarization layer.

The fifth conductive layer 160 may be disposed on the first via layer VIA1 The fifth conductive layer 160 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The fifth conductive layer 160 may include a connection electrode 161. The connection electrode 161 may be electrically connected to the second source/drain electrode 152 via the fifth contact hole CNT5 penetrating the first via layer VIA1 and the passivation layer PVX to expose the second source/drain electrode 152 of the transistor disposed in the silicon semiconductor region AR1.

The second via layer VIA2 (or planarization layer) may be disposed on the connection electrode 161. The second via layer VIA2 may include an inorganic insulating material or an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The second via layer VIA2 may include a light blocking portion (or first region) RE1. Most light may not be able to pass through the first region RE1 and may be blocked by the first region RE1. The first region RE1 may be disposed all over the second via layer VIA2. The light transmittance of the first region RE1 may be, but is not limited to, equal to or less than about 3% or equal to less than about 10%. The transmittance may be an average of transmittances measured all over the first region RE1. The first region RE1 may be a light blocking region for blocking most light. For example, the second via layer VIA2 may include a light blocking planarization layer. The light transmittance of the first region RE1 of the second via layer VIA2 may be less than that of the first via layer VIA1.

The second via layer VIA2 may include the same or similar material as that of the first via layer VIA1 and it may include a light blocking material (or light absorbing material). The light blocking material may absorb light to prevent the light from passing through the first region RE1 of the second via layer VIA2. The light blocking material may be disposed in the first region RE1 without being limited thereto. For example, the first region RE1 may include a light blocking material (or light absorbing material). The light blocking material may include a dye, pigment, carbonblack, dispersion binder, or dispersion agent having a black color, and the first region RE1 may have a black color, without being limited thereto.

The first region RE1 may overlap the whole area of the second semiconductor layer OS and at least a portion of the first semiconductor layer PS. The first region RE1 may overlap at least a portion of the second gate electrode 142 and at least a portion of the third gate insulating layer GI3. The first region RE1 may cover or overlap at least a portion of the top surface as well as the side surfaces of the connection electrode 161. The first region RE1 may overlap at least a portion of the connection electrode 161.

In the case where the second via layer VIA2 may include the first region RE1 as a light blocking region, no extra light blocking pattern may be disposed between the first and second via layers VIA1 and VIA2. Accordingly, the first region RE1 as the light blocking region of the second via layer VIA2 may remain mostly flat, and even more flat in the case where the first region RE1 may be disposed on the first via layer VIA1 as the planarization layer. In detail, the first region RE1 may include a first surface PL1 (or top surface) and a second surface PL2 (or bottom surface) facing the first surface PL1. The first surface PL1 may be arranged or disposed above the second surface PL2. The first and second surfaces PL1 and PL2 of the first region RE1 may be in disposed parallel with each other and may each be mostly flat.

The first region RE1 may have a thickness TH2 constant over the whole area thereof. The constancy of the thickness TH2 of the first region RE1 over the whole area thereof may allow the light transmittance, absorptivity, and reflectivity of the first region RE1 to remain uniform over all the first region RE1 and restrain or prevent the first region RE1 from being visually perceived from the outside. For example, the second via layer VIA2 including the first and second regions RE1 and RE2 and the pixel definition layer PDL or the like disposed on the second via layer VIA2 may not be visually perceived from the outside.

The flatness of the first surface PL1 of the first region RE1 may allow components being arranged or disposed on the first surface PL1 of the first region RE1 to be disposed mostly flat. For example, although not limited thereto, the anode electrode ANO being arranged or disposed on the first surface PL1 of the first region RE1 may be disposed mostly flat. The light emitting layer EL disposed on the anode electrode ANO and/or the pixel definition layer PDL disposed on the anode electrode ANO or the second via layer VIA2 may also be mostly flat. For example, the flatness of the anode electrode ANO, the light emitting layer EL, and/or the pixel definition layer PDL on the second via layer VIA2 may be improved, leading to improvement of flatness of a pixel PX.

The anode electrode ANO and the pixel definition layer PDL may be disposed on the first surface PL1 of the first region RE1. For example, the anode electrode ANO and the pixel definition layer PDL may be disposed in the first region RE1 and may directly contact the first surface PL1 of the first region RE1.

The pixel definition layer PDL may include a first surface PL3 of the pixel definition layer PDL and a second surface PL4 of the pixel definition layer PDL disposed above the first surface PL3 of the pixel definition layer PDL to face the first surface PL3 of the pixel definition layer PDL.

As the pixel definition layer PDL may be disposed on the first surface PL1 of the first region RE1, the first surface PL3 of the pixel definition layer PDL may be disposed to directly contact the first surface PL1 of the first region RE1. The first and second surfaces PL3 and PL4 of the pixel definition layer PDL may be mostly flat with the exception of the opening exposing the anode electrode ANO and may each be in parallel with the first surface PL1 of the first region RE1 and/or the second surface PL2 of the first region RE1.

The first region RE1 of the second via layer VIA2 may directly contact the first via layer VIA1 therebelow in at least part thereof. The top surface PL1 of the first region RE1 of the second via layer VIA2 may be in parallel with the top surface of the first via layer VIA1 However, the disclosure is not limited thereto, and the first via layer VIA1 may be omitted. In this case, the first region RE1 of the second via layer VIA2 may directly contact the passivation layer PVX.

The thickness TH2 of the first region RE1 may be substantially equal to the thickness TH2 of the second via layer VIA2 and less than the thickness TH1 of the first via layer VIA1. Without being limited thereto, the thickness TH2 of the first region RE1 may be equal to or less than about ⅓ or about ⅛ of the thickness TH1 of the first via layer VIA1 This may make it possible to save materials constituting the first region RE1 and the second via layer VIA2 and reduce processing costs. The thickness TH2 of the first region RE1 may be an average of the thicknesses measured all over the first region RE1, and the thickness TH1 of the first via layer VIA1 may be an average of the thicknesses measured all over the first via layer VIA1.

The anode electrode ANO may be disposed on the first surface PL1 of the first region RE1, and the light emitting layer EL may be disposed on the anode electrode ANO to block the light L1 emitted from the light emitting layer EL and the light L2 entering from the outside in advance. For example, the first region RE1 may be disposed on top of the lower part of the light emitting layer EL below the light emitting layer EL. This may make it possible to restrain or prevent the light L1 emitted by the light emitting layer EL and the light L2 entering from the outside from passing through the light emitting layer EL in advance and prevent diffused reflection components of the lights L1 and L2 below the light emitting layer EL from passing through the first semiconductor layer PS and/or the second semiconductor layer OS. As a consequence, it may also be possible to suppress or protect against degradation of device characteristics of the transistors (for example, T1 to T3 in FIG. 3) including the first semiconductor layer PS and/or the second semiconductor layer OS as channel regions.

Including the second via layer VIA2 in the first region RE1 as the light blocking region may improve the flatness of the pixel PX. This may make it possible to restrain or prevent a reflected color separated from external light from producing a reflected color stripe effect in the pixel PX and to suppress or prevent the degradation of color quality.

Figure 6:
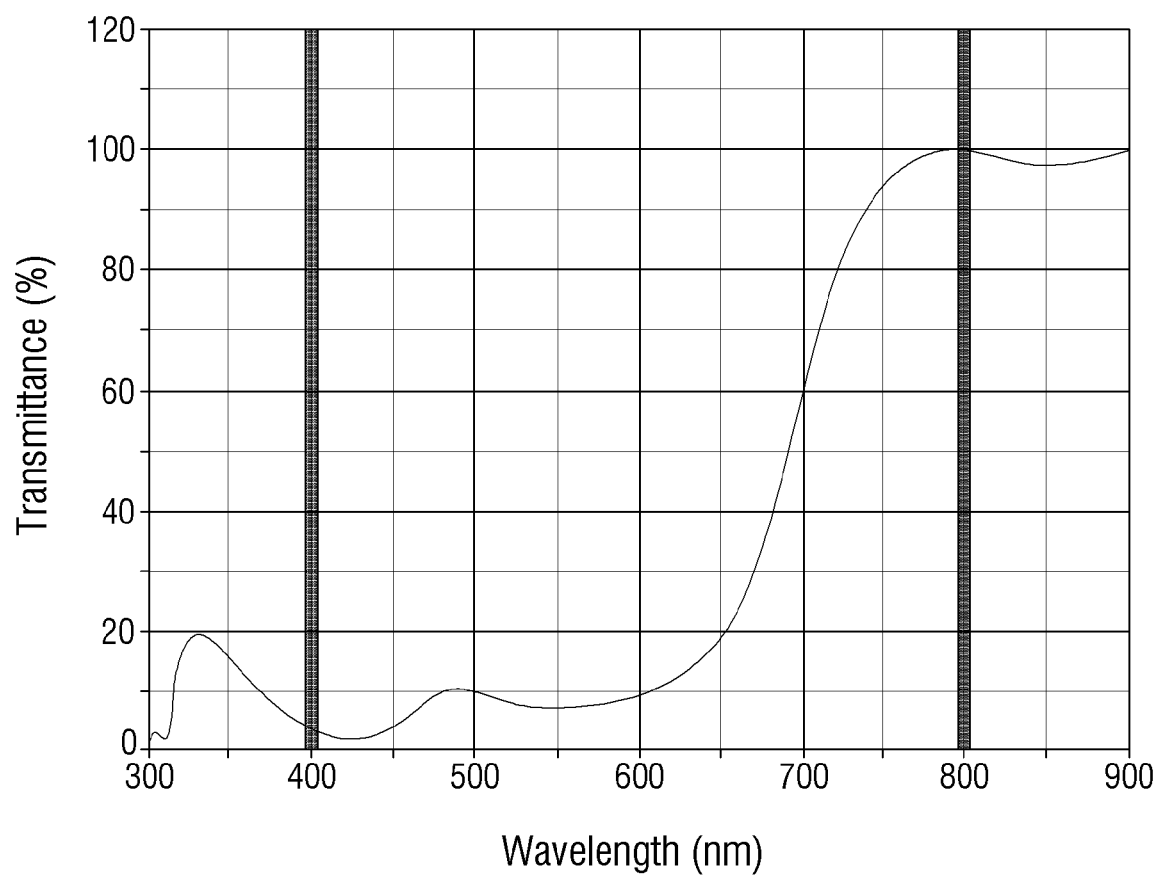
FIG. 6 is a graph showing light transmittance of a second via layer according to an embodiment.

The above description is elaborated in more detail with reference to FIG. 6.

FIG. 6 is a graph showing light transmittance of a second via layer according to an embodiment. In the graph of FIG. 6, the X-axis represents wavelength of a light (nm), and Y-axis represents light transmittance (%).

With reference to FIG. 6, it may be seen that the second via layer VIA2 blocks most light within the visible light spectrum. For example, the wavelength of the visible light spectrum may be in a range of about 400 nm to about 700 nm in which the light may have a light transmittance substantially equal to or less than about 10%. Although not shown, the light transmittance may be reduced by increasing the thickness of the second via layer VIA2 or increasing the content or proportion of a dye, pigment, carbon-black, dispersion binder, or dispersion agent having a black color included in the second via layer VIA2.

With reference to FIGS. 4 and 5 again, the anode electrode ANO may be disposed on the second via layer VIA2. The anode electrode ANO may be an anode electrode. The anode electrode ANO may be separately disposed per pixel. The anode electrode ANO may penetrate the second via layer VIA2 and may be electrically connected to the connection electrode 161 via the sixth contact hole CNT6 exposing a part of the connection electrode 161.

The anode electrode ANO may have a stacked structure formed by stacking a material layer having a high work function, such as indium tin oxide (ITO), indium zinc oxide (IZO), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be disposed above the reflective material layer and may be disposed closer to a light emitting layer EL. The anode electrode ANO may have a multilayer structure such as ITO/Mg, ITO/MgF, ITO/Ag and ITO/Ag/ITO, but is not limited thereto.

The pixel defining layer PDL may be disposed on the anode electrode ANO. The pixel defining layer PDL may include an opening partially exposing the anode electrode ANO. The pixel defining layer PDL may be formed of an organic insulating material or an inorganic insulating material. For example, the pixel defining layer PDL may include at least one of polyimide resin, acrylic resin, a silicon compound, or polyacrylic resin.

The light emitting layer EL may be disposed on the anode electrode ANO exposed by the pixel defining layer PDL. The light emitting layer EL may include an organic material layer. The organic material layer of the light emitting layer may include an organic light emitting layer, and may include a hole injecting/transporting layer and/or an electron injecting/transporting layer.

A cathode electrode CAT may be disposed on the light emitting layer EL. The cathode electrode CAT may be a common electrode disposed entirely without distinction of pixels PX. The anode electrode ANO, the light emitting layer EL, and the cathode electrode CAT may constitute an organic light emitting element.

The cathode electrode CAT may include a material layer having a low work function, such as Li, Ca, LiF/Ca, LiF/Al, Al, Mg, Ag, Pt, Pd, Ni, Au, Nd, Ir, Cr, BaF, Ba or a compound or mixture thereof (for example, a mixture of Ag and Mg). The cathode electrode CAT may include a transparent metal oxide layer disposed on the material layer having a low work function.

The anode electrode ANO, the light emitting layer EL, and the cathode electrode CAT may constitute an organic light emitting diode OLED.

On top of the cathode electrode CAT, a thin encapsulation layer 170 including a first inorganic layer 171, a first organic layer 172, and a second inorganic layer 173 may be disposed. The first and second inorganic layers 171 and 173 may contact each other at one end of the thin encapsulation layer 170. The first organic layer 172 may be encapsulated by the first inorganic layer 171 and the second inorganic layer 173.

Each of the first inorganic layer 171 and the second inorganic layer 173 may include silicon nitride, silicon oxide, silicon oxynitride, within the spirit and the scope of the disclosure. The first organic layer 172 may include an organic insulating material.

Hereinafter, other embodiments of the display device will be described. In the following embodiments, a description of the same components as those of the above-described embodiment will be omitted or simplified to avoid redundancy, and differences will be mainly described.

Figure 7:
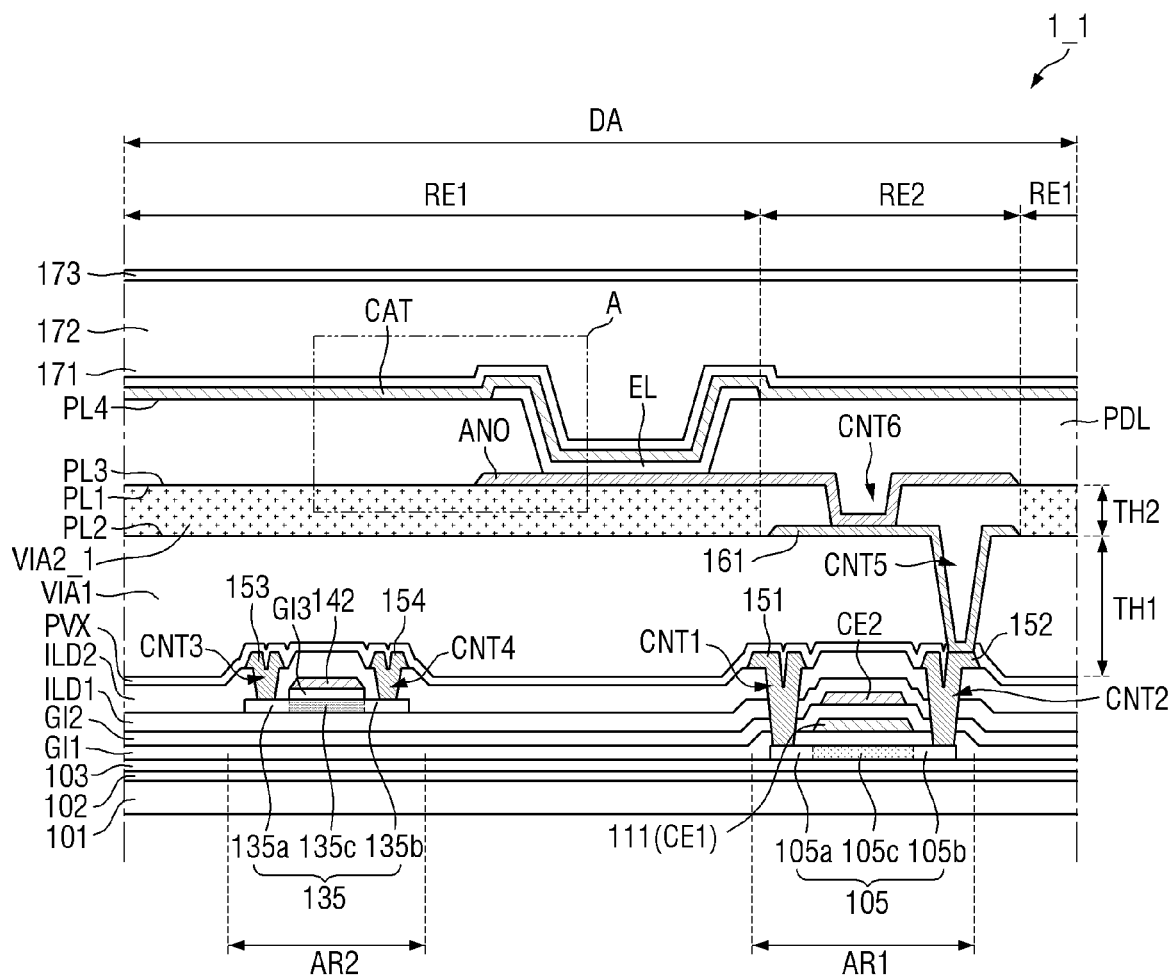
FIG. 7 is a schematic cross-sectional view of a display device according to an embodiment.

FIG. 7 is a schematic cross-sectional view of a display device according to an embodiment.

An embodiment of FIG. 7 may differ from an embodiment of FIG. 4 in that the first region RE1 as the light blocking region may be disposed only at part of the second via layer VIA2_1 of the display device 1_1.

In detail, the second via layer VIA2_1 according to an embodiment including the first region RE1 may include a second region RE2 that may not overlap the first region RE1. The second region RE2 may have a light transmittance greater than that of the first region RE1. The second region RE2 may allow most light to pass therethrough. The light transmittance of the second region RE2 may be substantially equal to that of the first via layer VIA1.

The first region RE1 being disposed at a part of the second via layer VIA2_1 may be formed by selectively injecting a light blocking material at a part in an inkjet manner or selectively depositing a second via layer material including a light blocking material. It may also be possible to form the first region RE1 being disposed only at a part of the second via layer VIA2_1 by processing the top surface of the first via layer VIA1 to selectively dispose a light blocking material only at the corresponding part of the second via layer VIA2_1. It may also be possible to deposit a light blocking material all over the second via layer VIA2_1 and selectively remove the light blocking material at the corresponding part (second region RE2). However, the method for forming the first region RE1 being disposed only at a part of the second via layer VIA2_1 is not limited thereto.

Although the first and second regions RE1 and RE2 may be distinguished from each other in the drawing, some or a predetermined number of materials may be mixed at the boundary between the first and the second regions RE1 and RE2 according to the method for forming the first region RE1 disposed at a part of the second via layer VIA2_1. Accordingly, the light transmittance at the boundary may have a value in the range between the light transmittances of the first and second regions RE1 and RE2.

Even in this case, the flatness of the anode electrode ANO, the light emitting layer EL, and/or the pixel definition layer PDL on the second via layer VIA2_1 may be improved, which may also lead to improvement of flatness of the pixel PX. The light blocking region may also facilitate blocking external light, which may be able to suppress or prevent degradation of device characteristics of the transistors (for example, T1 to T7 in FIG. 3) including the first semiconductor layer PS and/or the second semiconductor layer OS as channel regions.

Figure 8:
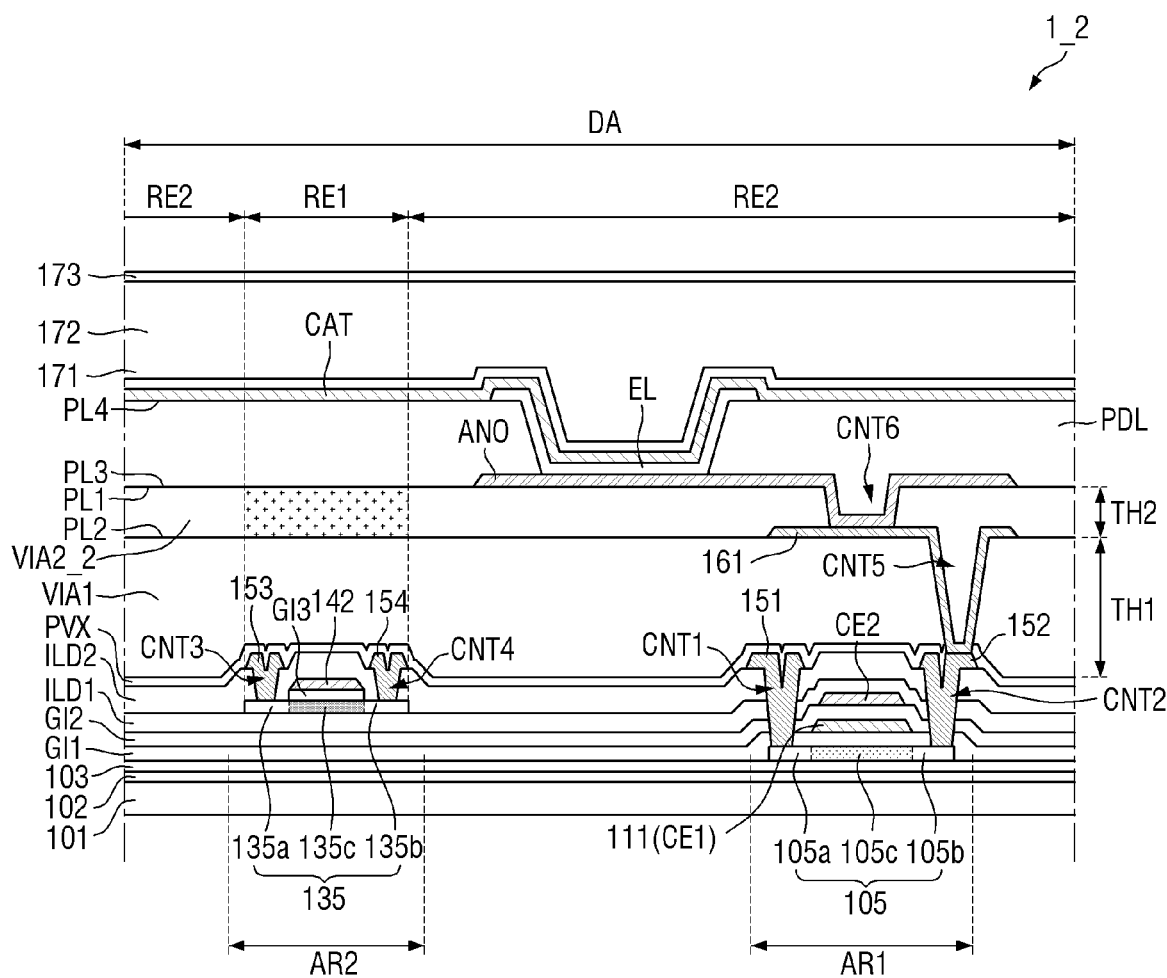
FIG. 8 is a schematic cross-sectional view of a display device according to an embodiment.

FIG. 8 is a schematic cross-sectional view of a display device according to an embodiment.

An embodiment of FIG. 8 may differ from an embodiment of FIG. 7 in that the first region RE1 of the second via layer VIA2_2 of the display device 1_2 may be formed in the same pattern as that of the second semiconductor layer OS in a plan view.

In detail, the first region RE1 of the second via layer VIA2_2 according to an embodiment may be formed in the same pattern as that of the second semiconductor layer OS in a plan view. The second semiconductor OS may entirely overlap the first region RE1 of the second via layer VIA2_2. Although the side surfaces of the first region RE1 of the second via layer VIA2_2 may be aligned with the side surfaces of the second semiconductor layer OS, the disclosure is not limited thereto. For example, although being formed in the same pattern as that of the second semiconductor layer OS in a plan view, the plan-view pattern of the first region RE1 may be greater in size than the plan-view pattern of the second semiconductor layer OS. For example, the plan-view pattern of the first region RE1 may be disposed in the form of being extended from the plan-view pattern of the second semiconductor layer OS.

Even in this case, there may be no need of a separate light blocking pattern above the first via layer VIA1, and the flatness of the anode electrode ANO, the light emitting layer EL, and/or the pixel definition layer PDL on top of the second via layer VIA2_2, may be improved, which may lead to improvement of flatness of the pixel PX. Furthermore, the first region RE1 may be disposed to occupy an area as small as possible on the second via layer VIA2_2, which may lead to reduction of processing costs.

Figure 9:
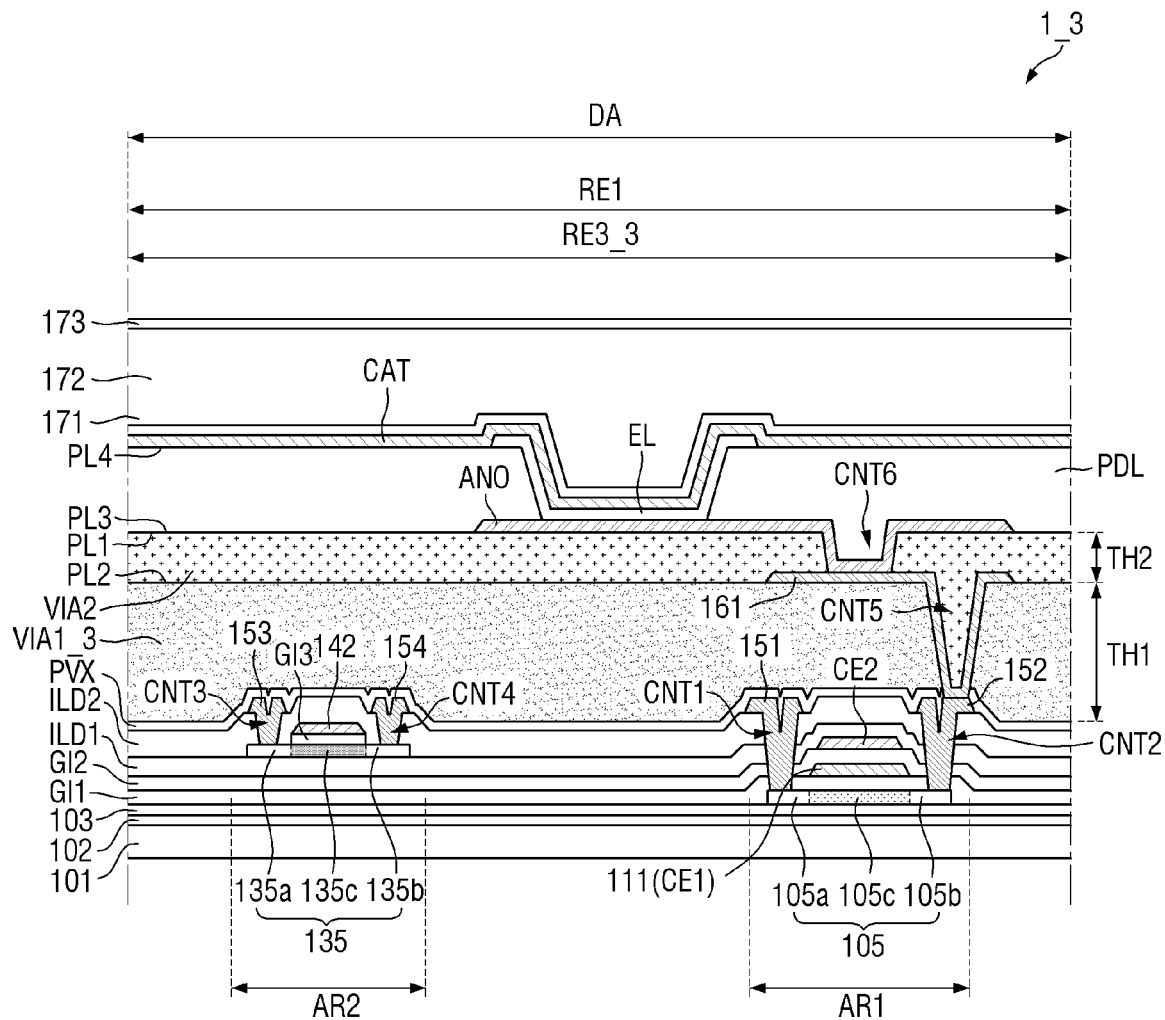
FIG. 9 is a schematic cross-sectional view of a display device according to an embodiment.

FIG. 9 is a schematic cross-sectional view of a display device according to an embodiment.

An embodiment of FIG. 9 may differ from an embodiment of FIG. 4 in that a first via layer VIA1_3 of a display device 1_3 may include a light blocking material.

In detail, the display device 1_3 may include the second via layer VIA2 including the first region RE1 and it may also include the first via layer VIA1_3 including a third region RE3_3 (or sub-light blocking region) according to an embodiment.

The third region RE3_3 may be disposed all over the first via layer VIA1_3. At least a portion of the third region RE3_3 may overlap the first region RE1 of the second via layer VIA2. The third region RE3_3 of the first via layer VIA1_3 may include a light blocking material and may have a light transmittance equal to or less than about 3% or equal to or less than about 10%. In this case, the first surface PL1 of the first region RE1 of the second via layer VIA2 may directly contact the third region RE3_3 of the first via layer VIA1_3. The light transmittance of the third region RE3_3 of the first via layer VIA1_3 may be equal to that of the first region RE1 of the second via layer VIA2, but the disclosure is not limited thereto.

Although the third region RE3_3 of the first via layer VIA1_3 may include the same light blocking material as that of the first region RE1 of the second via layer VIA2, the disclosure is not limited thereto, and the light blocking material included in the third region RE3_3 of the first via layer VIA1_3 may differ from the light blocking material of the second via layer VIA2.

Even in this case, there may be no need of a separate light blocking pattern on top of the first via layer VIA1_3, and the flatness of the anode electrode ANO, the light emitting layer EL, and/or the pixel definition layer PDL on top of the second via layer VIA2 may be improved, which may lead to improvement of flatness of the pixel PX. Furthermore, including the third region RE3_3 including the light blocking material in the first via layer VIA1_3 may reduce the light transmittance all over first and second via layers VIA1_3 and VIA2 and may further decrease the amount of the light reaching the first semiconductor layer PS and/or the second semiconductor layer OS.

Figure 10:
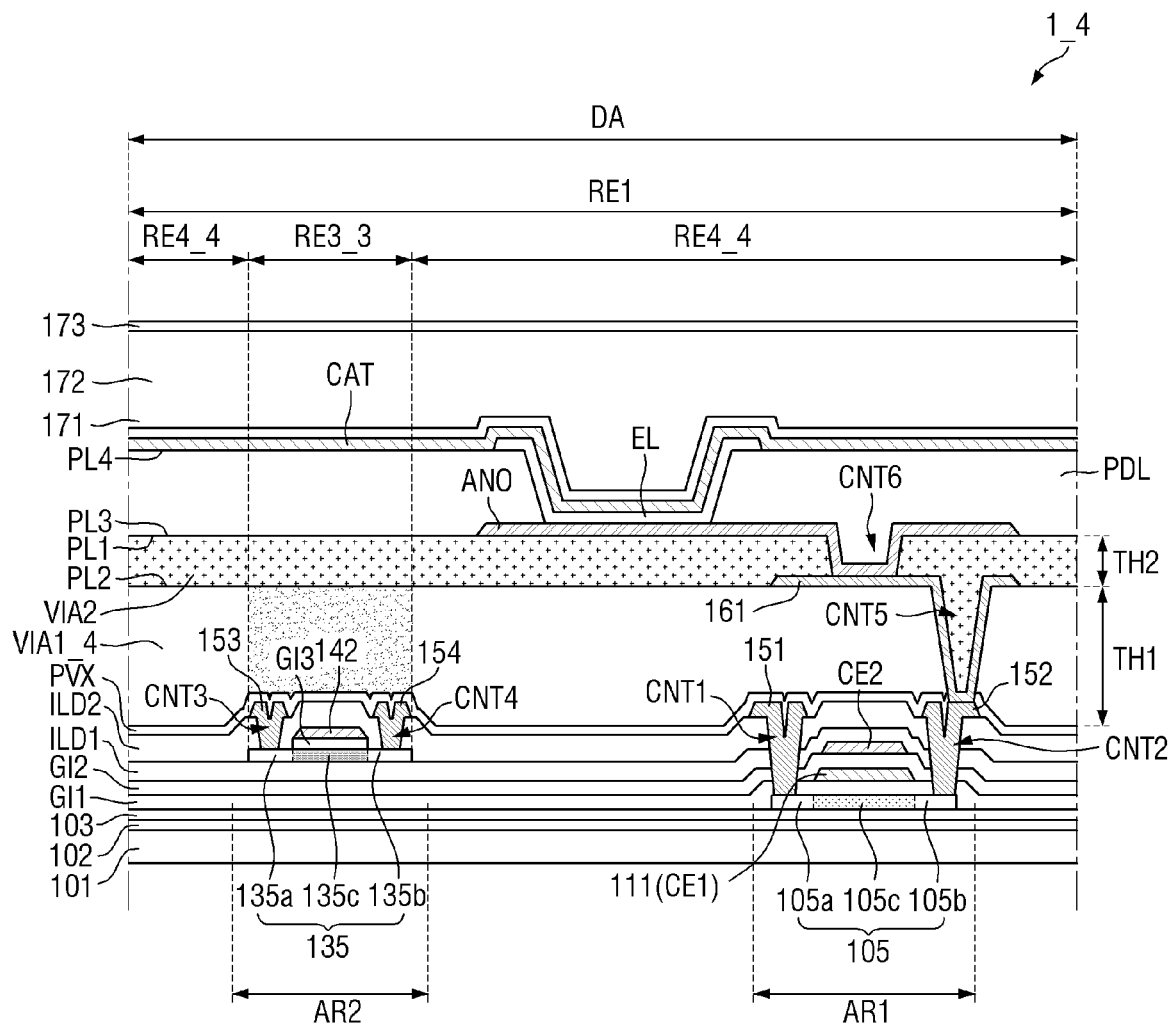
FIG. 10 is a schematic cross-sectional view of a display device according to an embodiment.

FIG. 10 is a schematic cross-sectional view of a display device according to an embodiment.

An embodiment of FIG. 10 may differ from an embodiment of FIG. 9 in that a third region RE3_3 of a first via layer VIA1_4 may be disposed only at a part of the first via layer VIA1_4.

In detail, the first via layer VIA1_4 of the display device 1_4 according to an embodiment may include the third region RE3_3 and the fourth region RE4_4. The third and fourth regions RE3_3 and RE4_4 may have different light transmittances. The third region RE3_3 may have substantially the same structure as that of the third region RE3_3 of FIG. 9, and the fourth region RE4_4 may have a light transmittance greater than that of the third region RE3_3. The light transmittance of the fourth region RE4_4 may be substantially equal to that of the first via layer VIA1 of FIG. 4.

The third region RE3_3 of the first via layer VIA1_4 may be formed to have the same pattern as that of the second semiconductor layer OS in a plan view. The second semiconductor layer OS may entirely overlap the third region RE3_3 of the first via layer VIA1_4. Although the side surfaces of the third region RE3_3 of the first via layer VIA1_4 may be aligned with the side surfaces of the second semiconductor layer OS, the disclosure is not limited thereto. For example, even when being formed in the same pattern as that of the second semiconductor layer OS in a plan view, the plan-view pattern of the third region RE3_3 may be greater in size than the plan-view pattern of the second semiconductor layer OS. For example, the plan-view pattern of the third region RE3_3 may be disposed in the form of being extended from the plan-view pattern of the second semiconductor layer OS.

Even in this case, there may be no need of a separate light blocking pattern above the first via layer VIA1, and the flatness of the anode electrode ANO, the light emitting layer EL, and/or the pixel definition layer PDL on top of the second via layer VIA2_2 may be improved, which may lead to improvement of flatness of the pixel PX. Furthermore, the third region R3_4 may be disposed to occupy an area as small as possible on the first via layer VIA1_4, which may lead to reduction of processing costs.

Figure 11:
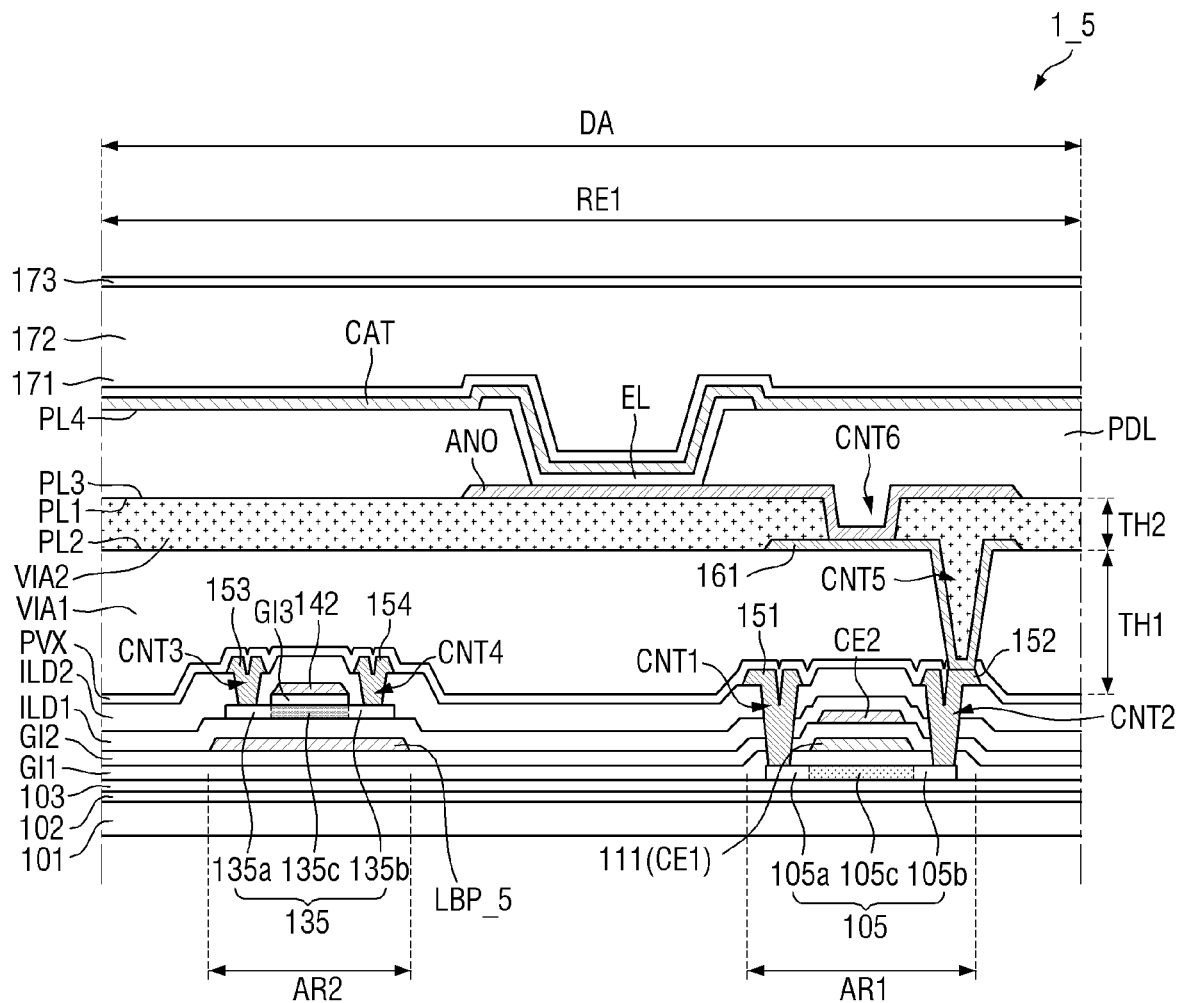
FIG. 11 is a schematic cross-sectional view of a display device according to an embodiment.

FIG. 11 is a schematic cross-sectional view of a display device according to an embodiment.

An embodiment of FIG. 11 may differ from an embodiment of FIG. 4 in that the display device 1_5 may include a sub-light blocking pattern LBP_5 disposed below the second semiconductor layer OS.

In detail, the second conductive layer 120_5 of the display device 1_5 according to an embodiment may include a sub-light blocking pattern LBP_5 as well as the second electrode CE2 of the capacitor Cst. The sub-light blocking layer LBP_5 may be disposed on the same layer as that of the second electrode CE2 of the capacitor Cst. For example, the sub-light blocking pattern LBP_5 and the second electrode CE2 of the capacitor Cst may be disposed on the second gate insulating layer GI2. The sub-light blocking pattern LBP_5 may be formed along with the second electrode CE2 of the capacitor Cst in the same process, which may mean no need of any extra process.

The sub-light blocking pattern LBP_5 may be arranged or disposed below the second semiconductor pattern 135 to prevent the light entering from below the second semiconductor pattern 135 from reaching the second semiconductor pattern 135 located or disposed thereabove. The sub-light blocking pattern LBP_5 may overlap at least the channel region 135c of the oxide semiconductor layer 135. The sub-light blocking pattern LBP_5 may be electrically connected to the second gate electrode 142 or one of the first and second source/drain electrodes 153 and 154 of the transistor arranged or disposed in the oxide transistor region AR2.

Even in this case, there is may be no need of a separate light blocking pattern on top of the first via layer VIA1, and the flatness of the anode electrode ANO, the light emitting layer EL, and/or the pixel definition layer PDL on top of the second via layer VIA2 is improved, which leads to improvement of flatness of the pixel PX. Furthermore, disposing the sub-light blocking pattern LBP_5 below the second semiconductor pattern 135 may be capable of blocking the light reaching the second semiconductor pattern 135, which may facilitate suppressing or preventing degradation of device characteristics of the transistors arranged or disposed in the oxide transistor region AR2.

Figure 12:
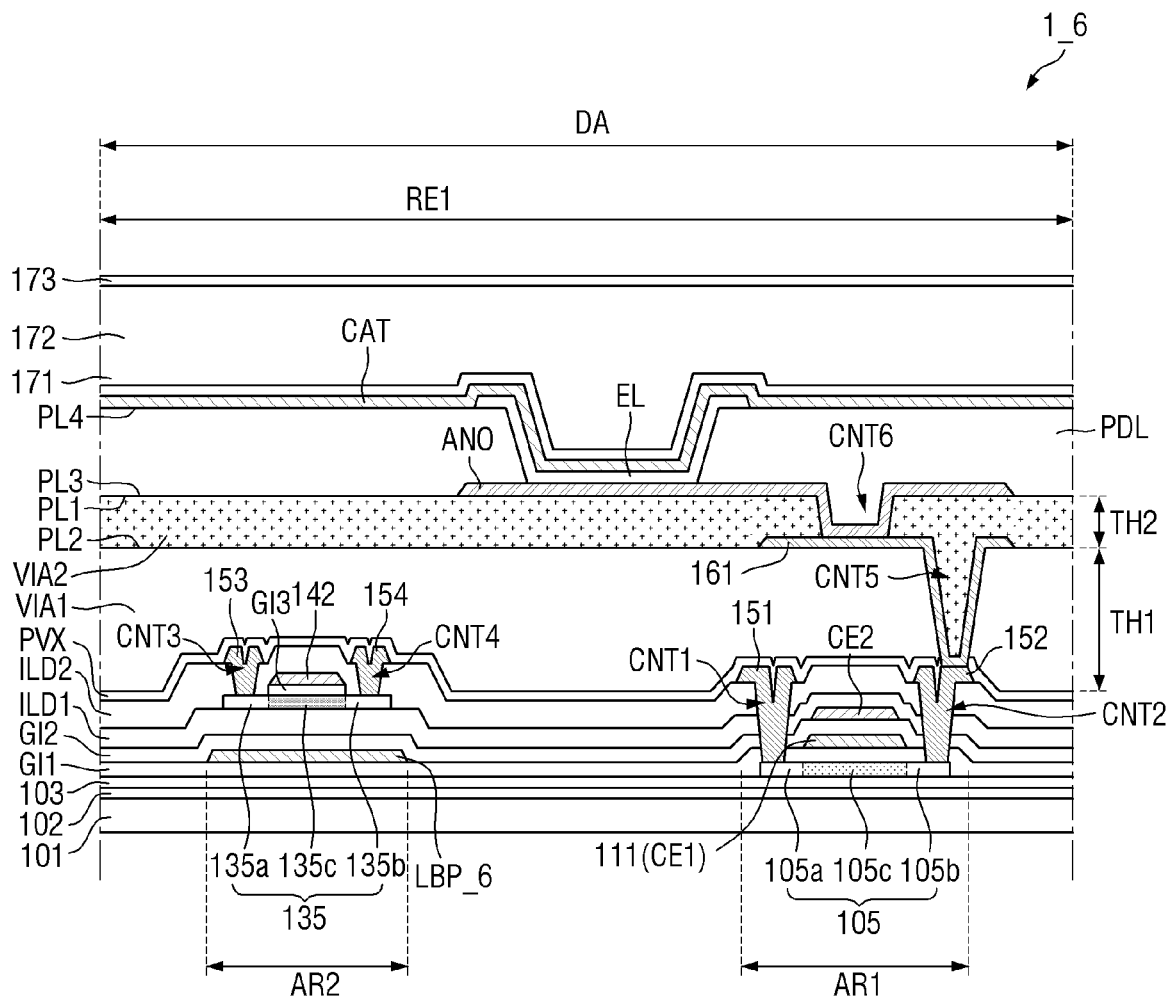
FIG. 12 is a schematic cross-sectional view of a display device according to an embodiment.

FIG. 12 is a schematic cross-sectional view of a display device according to an embodiment.

An embodiment of FIG. 12 may differ from an embodiment of FIG. 11 in that a display 1_6 may include a sub-light blocking pattern LBP_6 that may be disposed on the or a same layer as the first gate electrode 111.

In detail, the first conductive layer 110_6 of the display device 1_6 according to this embodiment may include a sub-light blocking pattern LBP_1 in addition to the first gate electrode 111. The sub-light blocking pattern LBP_6 may be disposed on the same layer as the first gate electrode 111. For example, the sub-light blocking pattern LBP_6 and the first gate electrode 111 may be arranged or disposed on the first gate insulating layer GI1. The sub-light blocking pattern LBP_6 may be formed along with the first gate electrode 111 in the same process, which may mean no need of any extra process.

The sub-light blocking pattern LBP_6 may be arranged or disposed below the second semiconductor pattern 135 to prevent the light entering from below the second semiconductor pattern 135 from reaching the second semiconductor pattern 135 located or disposed thereabove. The sub-light blocking pattern LBP_6 may overlap at least the channel region 135c of the oxide semiconductor layer 135. The sub-light blocking pattern LBP_6 may be electrically connected to the second gate electrode 142 or one of the first and second source/drain electrodes 153 and 154 of the transistor arranged or disposed in the oxide transistor region AR2.

Even in this case, there may be no need of a separate light blocking pattern on top of the first via layer VIA1, and the flatness of the anode electrode ANO, the light emitting layer EL, and/or the pixel definition layer PDL on top of the second via layer VIA2 may be improved, which may lead to improvement of flatness of the pixel PX. Furthermore, disposing the sub-light blocking pattern LBP_6 below the second semiconductor pattern 135 may be capable of blocking light reaching the second semiconductor pattern 135, which may facilitate suppressing or preventing degradation of device characteristics of the transistors arranged or disposed in the oxide transistor region AR2.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. A display device comprising:
   a first semiconductor pattern disposed on a substrate;
   a first insulating layer disposed on the first semiconductor pattern;
   a first gate electrode disposed on the first insulating layer;
   a second insulating layer disposed on the first gate electrode;
   a second semiconductor pattern disposed on the second insulating layer, a material of the second semiconductor pattern being different from a material of the first semiconductor pattern;
   a third insulating layer disposed on the second semiconductor pattern;
   a second gate electrode disposed on the third insulating layer;
   a first planarization layer overlapping the second gate electrode;
   a second planarization layer disposed on the first planarization layer and including a light blocking portion; and
   a pixel definition layer disposed on the second planarization layer,
   wherein at least a portion of the pixel definition layer directly contacts the light blocking portion of the second planarization layer.

2. The display device of claim 1, wherein
   the second planarization layer and the first planarization layer include a same material, and
   the second planarization layer includes a light absorbing material.

3. The display device of claim 1, wherein the first planarization layer includes a transparent region overlapping the light blocking portion of the second planarization layer.

4. The display device of claim 1, wherein
   the second planarization layer includes a light transmissive portion which does not overlap the light blocking portion of the second planarization layer, and
   a light transmittance of the light blocking portion is less than a light transmittance of the light transmissive portion.

5. The display device of claim 4, wherein the light transmittance of the light transmissive portion of the second planarization layer is same as a light transmittance of the first planarization layer.

6. The display device of claim 1, wherein a top surface of the first planarization layer is parallel to a top surface of the light blocking portion of the second planarization layer.

7. The display device of claim 6, wherein the first planarization layer includes a sub-light blocking portion overlapping at least a portion of the light blocking portion of the second planarization layer.

8. The display device of claim 7, wherein a light transmittance of the sub-light blocking portion of the first planarization layer is same as a light transmittance of the light blocking portion of the second planarization layer.

9. The display device of claim 6, further comprising:
   an anode electrode disposed on the second planarization layer and directly contacting the light blocking portion of the second planarization layer,
   wherein the pixel definition layer includes an opening that partially exposes the anode electrode.

10. The display device of claim 1, wherein the light blocking portion of the second planarization layer overlaps an entire region of the second semiconductor pattern.

11. The display device of claim 10, wherein the light blocking portion of the second planarization layer and the second semiconductor pattern have a same pattern in a plan view.

12. The display device of claim 10, wherein the light blocking portion of the second planarization layer overlaps at least a portion of the first semiconductor pattern.

13. The display device of claim 1, wherein a light transmittance of the light blocking portion of the second planarization layer is uniform in an entire region of the light blocking portion of the second planarization layer.

14. The display device of claim 1, wherein the light blocking portion of the second planarization layer is disposed in an entire region of the second planarization layer.

15. The display device of claim 14, further comprising:
    a connection electrode disposed between the first planarization layer and the second planarization layer,
    wherein a side surface and at least a portion of a top surface of the connection electrode directly contacts the light blocking portion of the second planarization layer.

16. The display device of claim 1, wherein the first semiconductor pattern includes polycrystalline silicon, and the second semiconductor pattern includes an oxide semiconductor.

17. A display device comprising:
    a semiconductor pattern disposed on a substrate;
    a gate insulating layer disposed on the semiconductor pattern;

a gate electrode disposed on the gate insulating layer;
an interlayer insulating layer disposed on the gate electrode;
a data wiring disposed on the interlayer insulating layer and electrically contacting a portion of the semiconductor pattern through a first contact hole formed in the interlayer insulating layer and the gate insulating layer;
a light transmissive planarization layer disposed on the data wiring;
a connection electrode disposed on the light transmissive planarization layer and electrically connected to the data wiring through a second contact hole formed in the light transmissive planarization layer;
a light blocking planarization layer disposed on the light transmissive planarization layer;
a pixel electrode disposed on the light blocking planarization layer and electrically connected to the connection electrode through a third contact hole formed in the light blocking planarization layer;
a pixel definition layer disposed on the light blocking planarization layer and including an opening to expose at least a portion of the pixel electrode;
an organic layer disposed on the pixel electrode; and
a common electrode disposed on the organic layer,
wherein a top surface of the light blocking planarization layer directly contacts the pixel definition layer.

18. The display device of claim 17, wherein the semiconductor pattern includes an oxide semiconductor.

19. The display device of claim 17, wherein the planarization layer overlaps an entire region of the semiconductor pattern.

20. The display device of claim 17, wherein a light transmittance of the light blocking planarization layer is uniform in an entire region of the light blocking planarization layer.

* * * * *